US00RE40586E

(19) United States
(12) Reissued Patent
Hrdina et al.

(10) Patent Number: US RE40,586 E
(45) Date of Reissued Patent: Nov. 25, 2008

(54) REDUCED STRIAE EXTREME ULTRA VIOLET ELEMENTS

(75) Inventors: Kenneth E. Hrdina, Horseheads, NY (US); John E. Maxon, Canton, NY (US); Brent R. Mclean, Canton, NY (US)

(73) Assignee: Corning Incorporated, Corning, NY (US)

(21) Appl. No.: 11/880,424
(22) Filed: Jul. 20, 2007

Related U.S. Patent Documents

Reissue of:
(64) Patent No.: 7,053,017
Issued: May 30, 2006
Appl. No.: 10/378,391
Filed: Mar. 3, 2003

U.S. Applications:
(60) Provisional application No. 60/362,052, filed on Mar. 5, 2002.

(51) Int. Cl.

| | |
|---|---|
| ***C03C 3/06*** | (2006.01) |
| ***C03C 3/076*** | (2006.01) |
| ***G21K 1/06*** | (2006.01) |
| ***G02B 5/08*** | (2006.01) |
| ***G02B 5/10*** | (2006.01) |

(52) U.S. Cl. ..... 501/54; 501/55; 378/34; 250/492.2; 359/838

(58) Field of Classification Search ..... 378/34; 250/492.2; 359/838; 501/54, 55
See application file for complete search history.

(56) References Cited

U.S. PATENT DOCUMENTS

| | | | |
|---|---|---|---|
| 4,668,086 | A | 5/1987 | Redner |
| 5,154,744 | A | 10/1992 | Blackwell et al. |
| 2002/0043080 | A1 | 4/2002 | Best et al. |

FOREIGN PATENT DOCUMENTS

| | | | |
|---|---|---|---|
| EP | 0901989 | A1 | 3/1999 |
| EP | 1033350 | A1 | 9/2000 |
| WO | WO 97/10487 | A1 | 3/1997 |
| WO | WO 00/17115 | A1 | 3/2000 |
| WO | WO 01/07967 | A1 | 2/2001 |
| WO | WO 01/08163 | A1 | 2/2001 |

OTHER PUBLICATIONS

Hrdina et al., "Characterization and Characteristics of a ULE® Glass Tailored for the EUVL Needs," SPIE Conference, (Mar. 9, 2002.)
U.S. Appl. No. 10/085,838, filed (Feb. 27, 2002), Bowden et al.

*Primary Examiner*—David M. Brunsman
(74) *Attorney, Agent, or Firm*—Nixon Peabody LLP

(57) ABSTRACT

Titania-containing silica glass bodies and extreme ultraviolet elements having low levels of striae are disclosed. Methods and apparatus for manufacturing and measuring striae in glass elements and extreme ultraviolet elements are also disclosed.

18 Claims, 3 Drawing Sheets

REDUCED STRIAE EXTREME ULTRA VIOLET ELEMENTS

Matter enclosed in heavy brackets [ ] appears in the original patent but forms no part of this reissue specification; matter printed in italics indicates the additions made by reissue.

This application claims the priority and benefit of U.S. Provisional Application No. 60/362,052 titled "REDUCED STRIAE EXTREME UNTRAVIOLET LITHOGRAPHY ELEMENTS"; filed Mar. 5, 2002.

FIELD OF THE INVENTION

This invention relates to extreme ultraviolet elements made from glasses including silica and titania. More particularly, the invention relates to extreme ultraviolet elements having reduced striae and methods and apparatus for making such elements and measuring striae.

BACKGROUND OF THE INVENTION

Ultra low expansion glasses and soft x-ray or extreme ultraviolet (EUV) lithographic elements made from silica and titania traditionally have been made by flame hydrolysis of organometallic precursors of silica and titania. Ultra-low expansion silica-titania articles of glass made by the flame hydrolysis method are used in the manufacture of elements used in mirrors for telescopes used in space exploration and extreme ultraviolet or soft x-ray-based lithography. These lithography elements are used with extreme ultraviolet or soft x-ray radiation to illuminate, project and reduce pattern images that are utilized to form integrated circuit patterns. The use of extreme ultraviolet or soft x-ray radiation is beneficial in that smaller integrated circuit features can be achieved, however, the manipulation and direction of radiation in this wavelength range is difficult. Accordingly, wavelengths in the extreme ultraviolet or soft x-ray range, such as in the 1 nm to 70 nm range, have not been widely used in commercial applications. One of the limitations in this area has been the inability to economically manufacture mirror elements that can withstand exposure to such radiation while maintaining a stable and high quality circuit pattern image. Thus, there is a need for stable high quality glass lithographic elements containing for use with extreme soft x-ray radiation.

One limitation of ultra low expansion titania-silica glass made in accordance with the method described above is that the glass contains striae. Striae are compositional inhomogeneities which adversely affect optical transmission in lens and window elements made from the glass. Striae can be measured by a microprobe that measures compositional variations that correlate to coefficient of thermal expansion (CTE) variations of a few ppb/° C. In some cases, striae have been found to impact surface finish at an angstrom root mean rms level in reflective optic elements made from the glass. Extreme ultraviolet lithographic elements require finishes having a very low rms level.

It would be advantageous to provide improved methods and apparatus for manufacturing ultra low expansion glasses containing silica and titania. In particular, it would be desirable to provide extreme ultraviolet elements having reduced striae and methods and apparatus that are capable of producing such glass elements. In addition, it would be desirable to provide improved methods and apparatus for measuring striae in ultra low expansion glass and extreme ultraviolet lithographic elements.

SUMMARY OF THE INVENTION

The invention relates to ultra low expansion glass extreme ultraviolet optical or lithographic elements and methods for their manufacture. Methods and apparatus are provided for producing ultra low expansion glass bodies and extreme ultraviolet optical or lithographic elements having decreased striae. As used herein, the terms extreme ultraviolet (abbreviated as EUV) and soft x-ray will be used interchangeably to refer to short wavelengths of electromagnetic radiation between 1 nm and 70 nm. Presently, lithographic systems that utilize EUV radiation operate between 5 and 15 nm, and typically around 13 nm.

According to one embodiment of the invention, an extreme ultraviolet lithographic element is provided that includes a titania-containing silica glass having a polished and shaped surface and having a rms striae level less than about 0.05 mega Pascals. In another embodiment, the element has a peak to valley striae level less than about 0.2 mega Pascals. In certain embodiments, the glass contains between about 5 and 10 weight percent titania and has a coefficient of thermal expansion in the range of about +30 ppb/° C. to −30 ppb/° C. between about 20° C. and 35° C. In still other embodiments, the glass contains between about 6 weight % titania and 8 weight % titania and has a homogeneous CTE in the range of about +20 ppb/° C. to −20 ppb/° C. between about 20° C. and 35° C.

Still another embodiment of the invention relates to a method of manufacturing an extreme ultraviolet lithography element. The method includes the steps of providing a silicon-containing feedstock and a titanium-containing feedstock, delivering the feedstocks to a conversion site, and converting the feedstocks into titania-containing silica soot. The method further includes consolidating the titania-containing silica soot into a low inclusion, homogeneous titania-containing silica glass preform and finishing the titanium-containing glass preform into an extreme ultraviolet lithographic element having an rms striae level less than about 0.05 mega Pascals.

In certain embodiments, the conversion site includes a furnace having exhaust vents and the method includes maintaining said striae level by controlling exhaust vent flow during the manufacturing process. In some embodiments, the method includes providing the furnace with more than six exhaust vents. In other embodiments, the striae level is controlled by adjusting the distance between the preform and the burner. In still other embodiments, the soot is deposited into a cup mounted on an oscillating pattern of the table, and in particular by increasing the rotation rate of the table. For example, in some embodiments, the rotation rate of the boule is greater than about 6 rpm.

Another embodiment of the invention relates to a method of measuring striae in an extreme ultraviolet lithographic element which includes utilizing a polariscope to measure the optical retardance in the element as a function of position and converting the optical retardance to stress values. According to this embodiment, after the optical retardance as a function of position is measured, the retardance values are converted to a stress level value by knowing the path length, i.e. the thickness, over which optical retardance is measured and the stress optical coefficient of the material. In some embodiments, the polariscope has a sensitivity of at least 0.05 nm, and in other embodiments, the polariscope utilizes a light source having a beam size less than the spacing of the striae in the extreme ultraviolet lithographic element.

Thus, according to the present invention, extreme ultraviolet elements having reduced striae and methods and apparatus are provided for the manufacture of these elements and measurement of striae in these elements. Methods and apparatus are also provided for measuring low levels of striae in glasses and extreme ultraviolet elements.

Additional advantages of the invention will be set forth in the following detailed description. It is to be understood that both the foregoing general description and the following detailed description are exemplary and are intended to provide further explanation of the invention as claimed.

DETAILED DESCRIPTION

The invention provides glass bodies and extreme ultraviolet elements having low thermal expansion and homogeneous titanium concentrations and methods and apparatus for their manufacture. The methods and apparatus are particularly beneficial for the manufacture of extreme ultraviolet optical elements such as lithography substrates for both lithography masks and lithography mirror optics. The methods and apparatus substantially reduce striae problems encountered during the formation of boules, particularly when the glass is ground and polished into a curved mirror reflective surface that cuts across the planar striae levels.

The invention further pertains to making thermally stable EUV lithography structure objects such as optical mirror lithography element substrate structures and reflective lithography mask element substrate structures. PCT patent publication WO 01/08163, entitled EUV SOFT X-RAY PROJECTION LITHOGRAPHIC METHOD SYSTEM AND LITHOGRAPHY ELEMENTS commonly assigned to CORNING INCORPORATED and naming Davis et al. as inventors and WO 01/07967, entitled SOFT X-RAY PROJECTION LITHOGRAPHIC METHOD AND MASK DEVICES commonly assigned to CORNING INCORPORATED and naming Davis et al. as inventors, the contents of which are hereby incorporated by reference discloses EUV lithography mirror element and mask structures.

According to the present invention, methods and apparatus are provided for the production ultra low expansion titania-silica glass used in the manufacture of extreme ultraviolet lithographic elements. In overview, silica-titania powders are manufactured as shown in FIG. 1 through flame hydrolysis of silica-containing and titanium-containing feedstocks.

Figure 1:
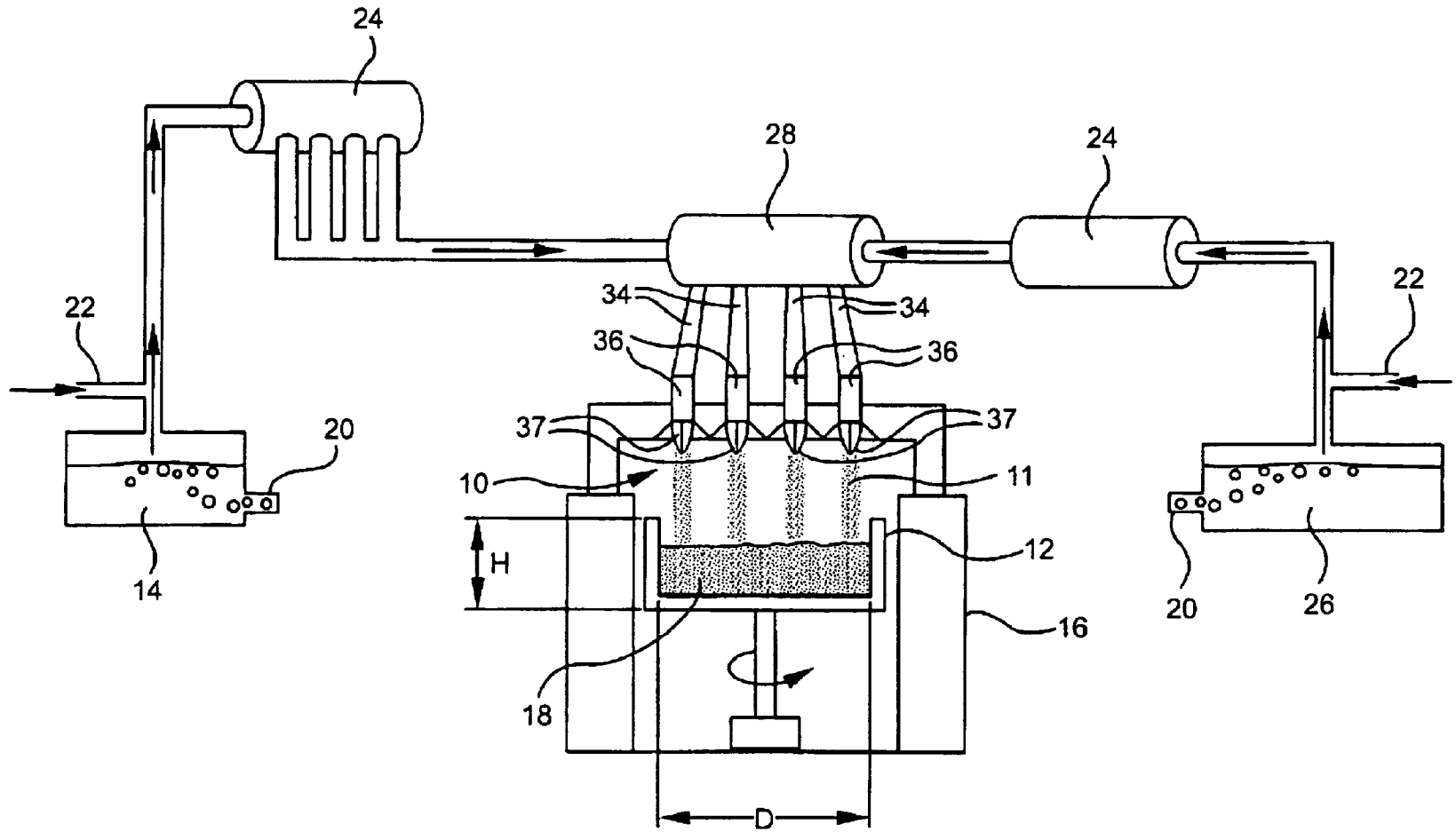
FIG. 1 is a schematic drawing of an apparatus for manufacturing ultra low expansion glass according to one embodiment of the invention.

As shown in FIG. 1, a conventional apparatus for the manufacture of titania-containing silica glasses includes high purity silicon-containing feedstock or precursor 14 and high purity titanium-containing feedstock or precursor 26. The feedstock or precursor materials are typically siloxanes, alkoxides and tetrachlorides containing titanium or silicon. One particular commonly used silicon-containing feedstock material is octamethylcyclotetrasiloxane, and one particular commonly used titanium-containing feedstock material is titanium isopropoxide. An inert bubbler gas 20 such as nitrogen is bubbled through feedstocks 14 and 26, to produce mixtures containing the feedstock vapors and carrier gas. An inert carrier gas 22 such as nitrogen is combined with the silicon feedstock vapor and bubbler gas mixture and with the titanium feedstock vapor and bubbler gas mixture to prevent saturation and to deliver the feedstock materials 14, 26 to a conversion site 10 within furnace 16 through distribution systems 24 and manifold 28. The silicon feedstock and vapor and titanium feedstock and vapor are mixed in a manifold 28 to form a vaporous, titanium-containing silica glass precursor mixture which is delivered through conduits 34 to burners 36 mounted in the upper portion 38 of the furnace 16. The burners 36 produce burner flames 37. Conversion site burner flames 37 are formed with a fuel and oxygen mixture such as methane mixed with hydrogen and/or oxygen, which combusts, oxidizes and converts the feedstocks at temperatures greater than about 1600° C. into soot 11. The burner flames 37 also provide heat to consolidate the soot 11 into glass. The temperature of the conduits 34 and the feedstocks contained in the conduits are typically controlled and monitored in minimize the possibility of reactions prior to the flames 37.

The feedstocks are delivered to a conversion site 10, where they are converted into titania-containing silica soot particles 11. The soot 11 is deposited in a revolving collection cup 12 located in a refractory furnace 16 typically made from zircon and onto the upper glass surface of a hot titania-silica glass body 18 inside the furnace 16. The soot particles 11 consolidate into a titania-containing high purity silica glass body.

The cup 12 typically has a circular diameter shape of between about 0.2 meters and 2 meters so that the glass body 18 is a cylindrical body having a diameter D between about 0.2 and 2 meters and a height H between about 2 cm and 20 cm. The weight percent of titania in the fused silica glass can be adjusted by changing the amount of either the titanium feedstock or silicon-containing feedstock delivered to the conversion site 10 that is incorporated into the soot 11 and the glass 18. The amount of titania and/or silica is adjusted so that the glass body has a coefficient of thermal expansion of about zero at the operating temperature of an EUV or soft x-ray reflective lithography or mirror element.

The powders are collected in the cup and consolidated into a glass boule. Typically, temperatures above 1600° C. are sufficient to consolidate the powder into a glass boule. After a boule of the desired size is formed, the glass boule can be removed from the furnace for further processing.

Figure 2:
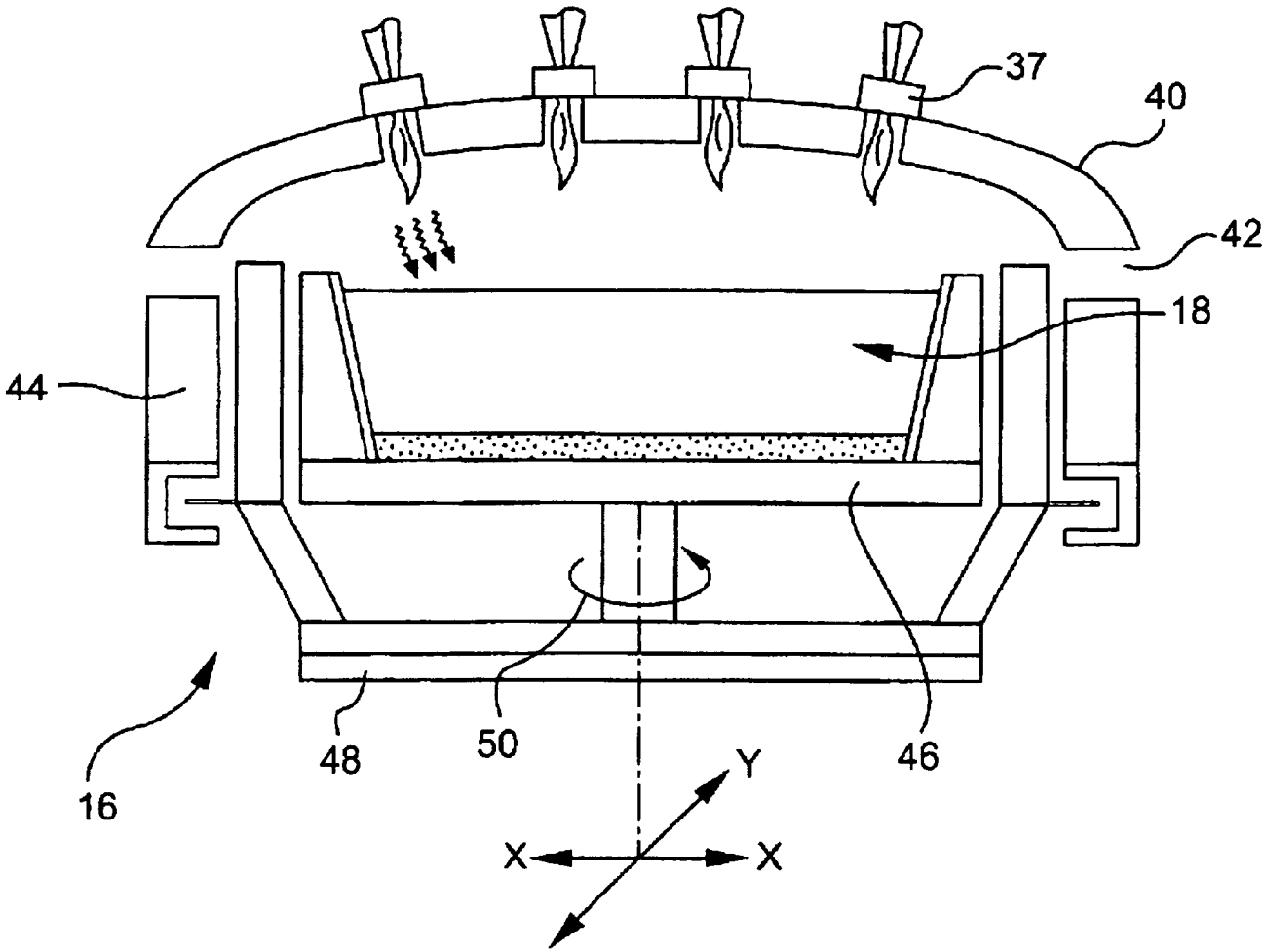
FIG. 2 is a schematic drawing of an apparatus for manufacturing ultra low expansion glass according to one embodiment of the invention.

Referring now to FIG. 2, which shows the furnace in more detail, the furnace 16 further includes crown 40 which carries a plurality of burners 37 which produce silica soot. Further details on the structure and operation of furnaces of this type may be found in commonly assigned U.S. Pat. No. 5,951,730, the entire contents of which are incorporated herein by reference. Particular details on burner configurations for making fused silica boules may be found in commonly-assigned PCT patent publication number WO 00/17115. The furnace 16 also includes a plurality of exhaust ports or vents 42, evenly spaced around the circumference of the furnace. Typically, a furnace 16 includes 6 exhaust ports 42. The furnace further includes a ring wall 44 which supports the crown 40. The furnace also includes a rotatable base 46 mounted on an oscillation table 48 that oscillates in an the x and y direction as shown in FIG. 2. The base is rotatable about an axis 50. The crown 40, the ring wall 44, the base 46 and the lateral walls are all made from suitable refractory materials such as zircon.

Commonly assigned U.S. Pat. No. 5,696,038 describes oscillation and rotation patterns for improving off-axis homogeneity in fused silica boules. As disclosed in U.S. Pat. No. 5,696,038, the x-axis and y-axis oscillation patterns were defined by the equations:

$$x(t)=r_1\sin 2\pi\omega_1 t+r_2\sin 2\pi\omega_2 t$$

$$y(t)=r_1\cos 2\pi\omega_1 t+r_2\cos 2\pi\omega_2 t$$

where x(t) and y(t) represent the coordinates of the center of the boule as measured from the center of the furnace ringwall as a function of time (t) measured in minutes. The sum of r1 and r2 must be less than the difference between the radius of the ringwall and radius of the containment vessel or cup to avoid contact between these structures during formation of the boule. The parameters $r_1$, $r_2$, $\omega_1$, $\omega_2$, and a fifth parameter $\omega_3$, which represents the boule's rotation rate about its center in revolutions per minute (rpm) define the total motion of the boule. Typical values for $\omega_1$, $\omega_2$ and $\omega_3$ used in the manufacture of titania-containing silica boules are 1.71018 rpm, 3.63418 rpm and 4.162 rpm, respectively.

According to certain embodiments of the present invention, applicants have demonstrated that striae in silica-titania ultra low expansion glass boules can be reduced by modification of several manufacturing parameters during flame hydrolysis. Applicants have been able to manufacture boules and extreme ultraviolet elements having rms striae values less than about 0.05 MPa, preferably less than about 0.03 MPa, and more preferably less than about 0.02 MPa. Peak to valley striae values were reduced to less than 0.2 MPa and preferably less than 0.15 MPa. In one embodiment, the titania-silica glass contains between about 5 weight percent and 10 weight percent titania, and preferably the amount of titania is between about 6 weight percent and 10 weight percent. According to one preferred embodiment of the present invention, the titania-silica glass contains about 7 weight percent titania.

In certain preferred embodiments, powders, ultra low expansion glass bodies and EUV optical elements are provided having a homogeneous titania-silica glass titania level in the range from 6 wt. % to about 9 wt. % and a homogeneous CTE in the range of about +30 ppb/° C. to −30 ppb/° C. between about 20° C. and 35° C., preferably in the range of about +20 ppb/° C. to −20 ppb/° C. between about 20° C. and 35° C. More preferably, the powder, the glass and optical elements have a homogeneous titania-silica glass titania level in the range from 6 wt. % to about 9 wt. % and a homogeneous CTE in the range of about +10 ppb/° C. to −10 ppb/° C. between about 20° and 35° C., and most preferably a CTE in the range of about +5 ppb/° C. to −5 ppb/° C. between about 20° C. and 35° C., with the CTE having a variation in coefficient of thermal expansion less than 5 ppb/° C. Preferably the powder particles and the titania-containing silica glass have a titania level in the range from 6 wt. % to 8 wt. %. More preferably, the powder, the consolidated glass and the EUV optical substrate have a titania level in the range from 6 wt. % to 8 wt. %. More preferably, the titania-containing silica powder particles and the silica glass titania level are between about 6.8 and 7.5 wt. %.

Modifications to flame hydrolysis process that allowed for the manufacture of ultra low expansion titania-silica boules included making changes to the oscillation patterns of the boule during the flame hydrolysis process. As noted above, typical values for the manufacture of titania-silica boules for $\omega_1$, $\omega_2$ and $\omega_3$ are 1.71018 rpm, 3.63418 rpm and 4.162 rpm, respectively. Applicants have discovered that by increasing these values each to above 5.0 reduced striae levels in titania-silica glass produced by the flame hydrolysis process. In one particularly preferred embodiment, the values for $\omega_1$, $\omega_2$ and $\omega_3$ were increased to 7.0488, 7.7563 and 6.5736, respectively, resulting in a significant reduction in striae in the glass.

In addition to changing the oscillation pattern of the boule, applicants observed other factors that impacted striae. In one experiment, flows through the exhaust ports or vents in the furnace were adjusted to determine the effect on striae. Plugging or reduction of vents in the furnace caused the striae in the titania silica glass to be worse than when operating the furnace with six vents. Thus, increasing the number of vents or exhaust ports beyond the six exhaust ports contained in a standard furnace will likely improve striae values. Another observation during experimentation was that titania-silica glass near the bottom of the cup contained less striae than titania-silica glass near the top of the cup. This led to the conclusion that both the distance of the burners from the bottom of the cup and the depth of the cup impact striae, and that a deeper cup and increasing the distance between the burners and the boule surface should reduce striae.

In another aspect of the invention, improved methods for measuring striae were developed. One way for measuring striae in titania-silica glass involves using a microprobe, which measures titania concentration in the glass at one micron intervals. One disadvantage of using a microprobe for measuring striae is that such measurements are very time consuming and extensive sample preparation is required. Thus, the use of a microprobe for regularly measuring striae is not cost-effective.

Applicants have discovered that a polariscope, which measures optical retardation in glass samples, can be used to measure striae in titania-silica glass. As polarized light propagates through a strained glass or plastic material, it experiences a retardation proportional to the amount of stress. A polariscope is an instrument which quantitatively measures this retardation. Stress in a sample can be determined by knowing the amount of retardation, the path length of light through the sample, which is typically the sample thickness, and the birefringence or stress optical constant of a sample which is a known value. U.S. Pat. No. 4,668,086 contains more information on the operation and construction of a polariscope.

Figure 3:
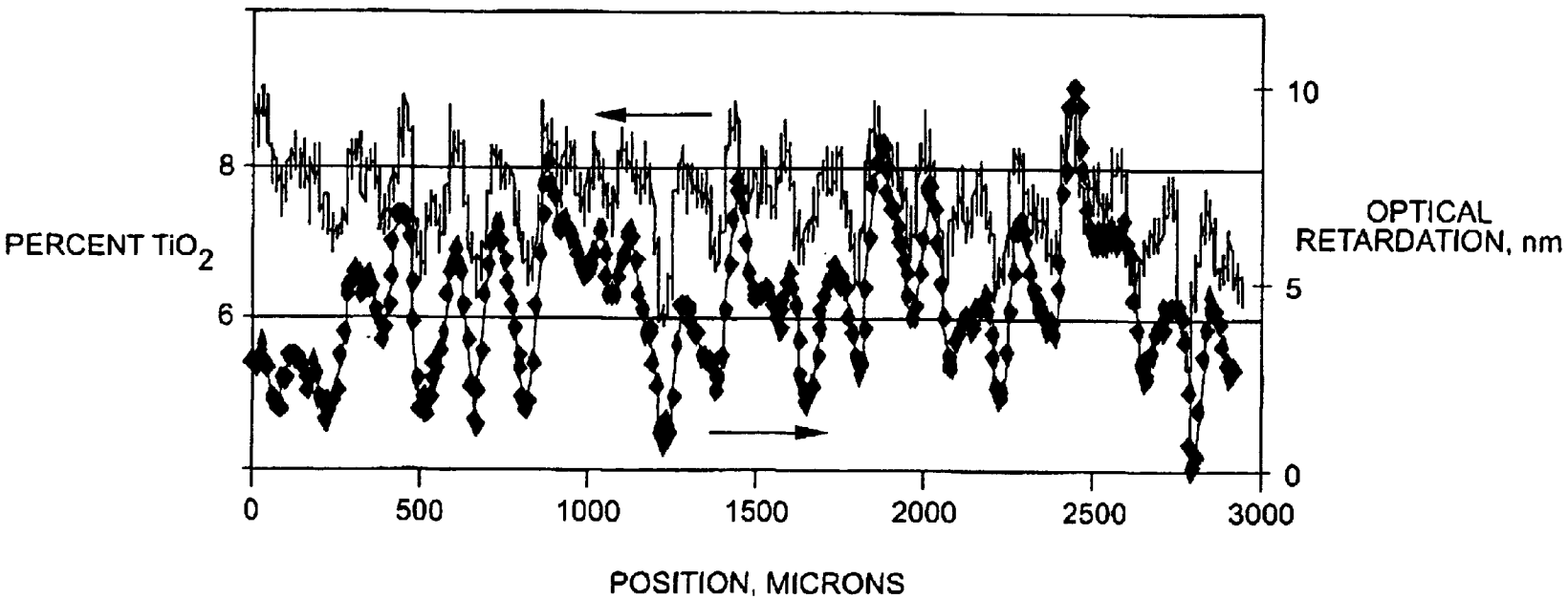
FIG. 3 is a graph comparing striae measurement techniques utilizing a polariscope and utilizing a microprobe.

Thus, the polariscope measures retardance through a sample as a function of position. The spatial resolution of a polariscope is much smaller than the size of the striae in titania-silica glass and therefore allows for measurement through striae layers. The retardance observed in the polariscope indicates stresses between striae layers, which are most likely due to thermal expansion mismatch between the layers. FIG. 3 shows a comparison of striae measurements made on a sample. The lower line in FIG. 3 represents striae measurements made by a polariscope, and the upper line represents measurements made by a microprobe. The polariscope used is available from Cambridge Research Instrumentation, Model LC, which was used with a Nikon microscope. As indicated by FIG. 3, there is good correlation between the two techniques, which shows that the polariscope can be used to measure striae in titania-silica glass and optical elements such as extreme ultraviolet lithographic elements. An advantage of using a polariscope is that method is very sensitive (as high as 0.01 nm), and light beam sizes smaller than the spacing of the striae (e.g., 50–300 microns) can be used.

It will be apparent to those skilled in the art that various modifications and variations can be made to the present invention without departing from the spirit or scope of the invention. Thus, it is intended that the present invention covers modifications and variations of this invention provided they come within the scope of the appended claims and their equivalents.

What is claimed is:

1. An extreme ultraviolet lithographic element comprising:

a titania-containing silica having a titania content in the range of 5–10 wt. %, a polished and shaped surface, and an rms striae level less than 0.05 mega Pascals.

2. The lithography element of claim 1, wherein the element has a peak to valley striae level less than 0.2 mega Pascals.

3. The lithography element of claim 2, wherein the glass has a coefficient of thermal expansion in the range of +30 ppb/° C. to −30 ppb/° C. between 20° C. and 35° C.

4. The lithography element of claim 2, wherein the glass contains between 6 weight % titania and 8 weight % titania and has a homogeneous CTE in the range of +20 ppb/° C. to −20 ppb/° C. between about 20° C. and 35° C.

5. A glass bottle suitable for making extreme ultraviolet optical elements, said boule comprising a titania-silica glass having a titania content in the range of 5–10 wt. striae, a rms striae level less than 0.05 mega Pascals.

6. A glass boule according to claim 5, wherein said boule has a peak to valley striae level of less than 0.2 mega Pascals.

7. The boule according to claim 5, wherein said boule has a rms striae level of less than 0.04 mega Pascals.

8. The glass boule according to claim 5, wherein the titania content is in the range of 6 to 8 wt %.

[9. The glass boule according to claim 5, wherein the titania content is in the range of 6 to 8 wt %.]

10. The glass boule according to claim 5, wherein the glass has a coefficient of thermal expansion in the range of +30 ppb/° C. to −30 ppb/° C. between 20° C. and 35° C.

11. The glass boule according to claim 5, wherein the glass has a homogeneous CTE in the range of +20 ppb/° C. to −20 ppb/° C. between about 20° C. and 35° C.

*12. An extreme ultraviolet lithographic element comprising:*

*a titania-containing silica glass having a titania content in the range of 5-10 wt. %, a polished and shaped surface, and a peak to valley striae level less than 0.2 mega Pascals.*

*13. The lithography element of claim 12, wherein the glass has a coefficient of thermal expansion in the range of +30 ppb/° C. to −30 ppb/° C. between 20° C. and 35° C.*

*14. The lithography element of claim 12, wherein the glass contains between 6 weight % titania and 8 weight % titania and has a homogenous CTE in the range of +20 ppb/° C. to −20 ppb/° C. between about 20° C. and 35° C.*

*15. A glass boule suitable for making extreme ultraviolet optical elements, said boule comprising a titania-silica glass having a titania content in the range of 5-10 wt. %* and a peak to valley striae level of less than 0.2 mega Pascals.

*16. The boule according to claim 15, wherein said boule has a rms striae level of less than 0.04 mega Pascals.*

*17. The glass boule according to claim 15, wherein the titania content is in the range of 6 to 8 wt %.*

*18. The glass boule according to claim 15, wherein the glass has a coefficient of thermal expansion in the range of +30 ppb/° C. to −30 ppb/° C. between 20° C. and 35° C.*

*19. The glass boule according to claim 15, wherein the glass has a homogeneous CTE in the range of +20 ppb/° C. to −20 ppb/° C. between about 20° C. and 35° C.*

* * * * *